United States Patent
Jagannathan et al.

(10) Patent No.: US 10,304,831 B2
(45) Date of Patent: *May 28, 2019

(54) SINGLE SOURCE/DRAIN EPITAXY FOR CO-INTEGRATING NFET SEMICONDUCTOR FINS AND PFET SEMICONDUCTOR FINS

(71) Applicant: International Business Machines Corporation, Armonk, NY (US)

(72) Inventors: Hemanth Jagannathan, Guilderland, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 2 days.

This patent is subject to a terminal disclaimer.

(21) Appl. No.: 15/600,972

(22) Filed: May 22, 2017

(65) Prior Publication Data

US 2017/0256546 A1 Sep. 7, 2017

Related U.S. Application Data

(60) Continuation of application No. 15/082,622, filed on Mar. 28, 2016, now Pat. No. 9,659,938, which is a
(Continued)

(51) Int. Cl.
*H01L 27/092* (2006.01)
*H01L 29/06* (2006.01)
(Continued)

(52) U.S. Cl.
CPC ...... *H01L 27/0924* (2013.01); *H01L 21/2251* (2013.01); *H01L 21/2258* (2013.01);
(Continued)

(58) Field of Classification Search
CPC . H01L 27/0924; H01L 29/20; H01L 27/0922; H01L 21/2251; H01L 21/2258;
(Continued)

(56) References Cited

U.S. PATENT DOCUMENTS 5,689,124 A 11/1997 Morikawa et al.
7,282,425 B2 10/2007 Koester et al.
(Continued)

OTHER PUBLICATIONS

Collart et. al., "Low Energy boron implantation in silicon and room temperature diffusion", Nuclear Instruments and Methods in Physics Research B, 139, pp. 98-107 (published Apr. 1998).*
(Continued)

*Primary Examiner* — Bilkis Jahan
*Assistant Examiner* — Victor V Barzykin
(74) *Attorney, Agent, or Firm* — Scully, Scott, Murphy & Presser, P.C.; Daniel P. Morris, Esq.

(57) ABSTRACT

A plurality of gate structures are formed straddling nFET semiconductor fins and pFET semiconductor fins which extend upwards from a surface of a semiconductor substrate. A boron-doped silicon germanium alloy material is epitaxially grown from exposed surfaces of both the nFET semiconductor fins and the pFET semiconductor fins not protected by the gate structures. An anneal is then performed. During the anneal, silicon and germanium from the boron-doped silicon germanium alloy material diffuse into the nFET semiconductor fins and act as an n-type dopant forming a junction in the nFET semiconductor fins. Since boron is a Group IIIA element it does not have any adverse effect. During the same anneal, boron from the boron-doped silicon germanium alloy material will diffuse into the pFET semiconductor fins to form a junction therein.

16 Claims, 3 Drawing Sheets

Related U.S. Application Data division of application No. 14/496,815, filed on Sep. 25, 2014, now Pat. No. 9,299,706.

(51) Int. Cl.

| | |
|---|---|
| H01L 29/161 | (2006.01) |
| H01L 29/167 | (2006.01) |
| H01L 29/20 | (2006.01) |
| H01L 21/8258 | (2006.01) |
| H01L 21/8238 | (2006.01) |
| H01L 21/225 | (2006.01) |
| H01L 21/324 | (2006.01) |
| H01L 29/66 | (2006.01) |
| H01L 21/84 | (2006.01) |
| H01L 29/78 | (2006.01) |
| H01L 27/12 | (2006.01) |
| H01L 29/207 | (2006.01) |
| H01L 21/02 | (2006.01) |

(52) U.S. Cl.
CPC ........ *H01L 21/324* (2013.01); *H01L 21/8258* (2013.01); *H01L 21/823814* (2013.01); *H01L 21/823821* (2013.01); *H01L 21/845* (2013.01); *H01L 27/0922* (2013.01); *H01L 27/1211* (2013.01); *H01L 29/0653* (2013.01); *H01L 29/161* (2013.01); *H01L 29/167* (2013.01); *H01L 29/20* (2013.01); *H01L 29/207* (2013.01); *H01L 29/6681* (2013.01); *H01L 29/66545* (2013.01); *H01L 29/7848* (2013.01); *H01L 21/0262* (2013.01); *H01L 21/02532* (2013.01); *H01L 21/02579* (2013.01); *H01L 21/02636* (2013.01); *H01L 21/823828* (2013.01)

(58) Field of Classification Search
CPC ............. H01L 29/6681; H01L 21/8258; H01L 29/0653; H01L 21/324; H01L 21/823814; H01L 21/823828; H01L 29/161; H01L 29/167

See application file for complete search history.

(56) References Cited

U.S. PATENT DOCUMENTS

| | | | |
|---|---|---|---|
| 8,569,152 | B1 | 10/2013 | Basker et al. |
| 8,586,455 | B1 | 11/2013 | Chang et al. |
| 8,796,093 | B1 | 8/2014 | Cheng et al. |
| 2009/0230432 | A1 | 9/2009 | Miyashita |
| 2010/0224943 | A1 | 9/2010 | Kawasaki |
| 2010/0244103 | A1 | 9/2010 | Chan et al. |
| 2011/0049568 | A1 | 3/2011 | Lochtefeld et al. |
| 2011/0133285 | A1 | 6/2011 | Liaw |
| 2011/0210404 | A1 | 9/2011 | Su et al. |
| 2011/0309333 | A1 | 12/2011 | Cheng et al. |
| 2012/0273894 | A1 | 11/2012 | Chen et al. |
| 2012/0276695 | A1 | 11/2012 | Cheng et al. |
| 2013/0099282 | A1 | 4/2013 | Chen et al. |
| 2013/0153964 | A1 | 6/2013 | Guo et al. |
| 2013/0168771 | A1 | 7/2013 | Wu et al. |
| 2014/0001562 | A1 | 1/2014 | Liaw |
| 2014/0106528 | A1 | 4/2014 | Ouyang et al. |
| 2015/0028387 | A1 | 1/2015 | Majumdar et al. |
| 2015/0123166 | A1 | 5/2015 | Jacob et al. |
| 2015/0137181 | A1 | 5/2015 | Basker et al. |
| 2015/0279973 | A1 | 10/2015 | Akarvardar et al. |
| 2015/0303281 | A1 | 10/2015 | Fogel et al. |

OTHER PUBLICATIONS

Orlowski, M., et al., "Si, SiGe, Ge, and III-V Semiconductor Nanomembranes and Nanowires Enabled by SiGe Epitaxy", ECS Transactions, 218th ECS Meeting, Oct. 10-15, 2010, Las Vegas, NV, vol. 33, Issue 6, pp. 777-789.

Takagi, S., et al., "Ge/III-V Channel Engineering for future CMOS", ECS Transactions, 215th ECS Meeting May 24-May 29, 2009, San Francisco, CA, pp. 9-20, vol. 19, Issue 5.

Takagi, S., et al., "Device and Integration Technologies of III-V/Ge Channel CMOS", ECS Transactions, 220th ECS Meeting, Oct. 9-Oct. 14, 2011, Boston, MA, pp. 203-218, vol. 41, Issue 7.

Gui, Z. X., "Self-Aligned Source and Drain Contact Engineering for High Mobility III-V Transistor", PhD thesis., National University of Singapore, Mar. 2013, 201 pages.

Chin, H.-C., et al., "III-V Multiple-Gate Field-Effect Transistors With High-Mobility In0.7Ga0.3As Channel and Epi-Controlled Retrograde-Doped Fin", IEEE Electron Device Letters, Feb. 2011, pp. 146-148, vol. 32, No. 2.

Hill, R. J. W., et al., "Self-aligned III-V MOSFETs heterointegrated on a 200 mm Si substrate using an industry standard process flow", Electron Devices Meeting (IEDM), 2010, IEEE International, Date of Conference: Dec. 6-8, 2010, pp. 6.2.1-6.2.4, Conference Location: San Francisco, CA.

List of IBM Patents or Patent Applications Treated as Related dated May 22, 2017, 2 pages.

\* cited by examiner

SINGLE SOURCE/DRAIN EPITAXY FOR CO-INTEGRATING NFET SEMICONDUCTOR FINS AND PFET SEMICONDUCTOR FINS

BACKGROUND

The present application relates to a semiconductor structure and a method of forming the same. More particularly, the present application relates to a method of forming a semiconductor structure in which a single epitaxial deposition of a boron-doped silicon germanium alloy material is used to contact and, in some embodiments, merge nFET semiconductor fins and pFET semiconductor fins. The present application also relates to a semiconductor structure that is formed by the method of the present application.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (finFETs) is the next step in the evolution of complementary metal oxide semiconductor (CMOS) devices. Semiconductor fin field effect transistors (FETs) can achieve higher drive currents with increasingly smaller dimensions as compared to conventional planar FETs.

III-V compound semiconductor materials have a higher electron mobility than silicon and are thus an attractive channel material candidate for providing high performance nFET devices for future technology nodes. To realize high performance, low channel resistance and low parasitic series resistance in the source/drain regions are required. Moreover, there is a need to contact the III-V semiconductor materials within existing CMOS integration schemes.

SUMMARY

A plurality of gate structures are formed straddling nFET semiconductor fins and pFET semiconductor fins which extend upwards from a surface of a semiconductor substrate. A boron-doped silicon germanium alloy material is epitaxially grown from exposed surfaces of both the nFET semiconductor fins and the pFET semiconductor fins not protected by the gate structures. An anneal is then performed. During the anneal, silicon and germanium from the boron-doped silicon germanium alloy material diffuse into the nFET semiconductor fins and act as an n-type dopant forming a junction in the nFET semiconductor fins. Since boron is a Group IIIA element it does not have any adverse effect. During the same anneal, boron from the boron-doped silicon germanium alloy material will diffuse into the pFET semiconductor fins to form a junction therein.

In one aspect of the present application, a method of forming a semiconductor structure is provided. In one embodiment of the present application, the method includes providing a semiconductor substrate containing an nFET device region and a pFET device region, wherein a plurality of nFET semiconductor fins extend upwards from a surface of the semiconductor substrate in the nFET device region, and a plurality of pFET semiconductor fins extend upwards from another surface of the semiconductor substrate in the pFET device region. A plurality of gate structures is formed straddling each nFET semiconductor fin and each pFET semiconductor fin. A boron-doped silicon germanium alloy material is epitaxially grown from exposed surfaces of the nFET semiconductor fins and the pFET semiconductor fins not protected by the plurality of gate structures. Next, atoms of silicon and germanium are diffused from the boron-doped silicon germanium alloy material into the each of the nFET semiconductor fins not protected by the plurality of gate structures to provide a source/drain junction in the nFET semiconductor fins not protected by the plurality of gate structures. Atoms of boron are simultaneously diffused from the boron-doped silicon germanium alloy material into each of the pFET semiconductor fins not protected by the plurality of gate structures to provide a source/drain junction in the pFET semiconductor fins not protected by the plurality of gate structures.

In another aspect of the present application, a semiconductor structure is provided. In one embodiment of the present application, the semiconductor structure includes a semiconductor substrate containing an nFET device region and a pFET device region, wherein a plurality of nFET semiconductor fins extend upwards from a surface of the semiconductor substrate in the nFET device region, and a plurality of pFET semiconductor fins extend upwards from another surface of the semiconductor substrate in the pFET device region. A plurality of functional gate structures straddle each nFET semiconductor fin and each pFET semiconductor fin. A boron-doped silicon germanium alloy material protrudes from exposed surfaces of the nFET semiconductor fins and the pFET semiconductor fins not covered by the plurality of functional gate structures. In accordance with the present application, each of the nFET semiconductor fins not covered by the plurality of functional gate structures contain a source/drain junction comprising atoms of silicon and germanium, and each of the pFET semiconductor fins not covered by the plurality of functional gate structures contain a source/drain junction comprising atoms of boron.

DESCRIPTION

Figure 1A:
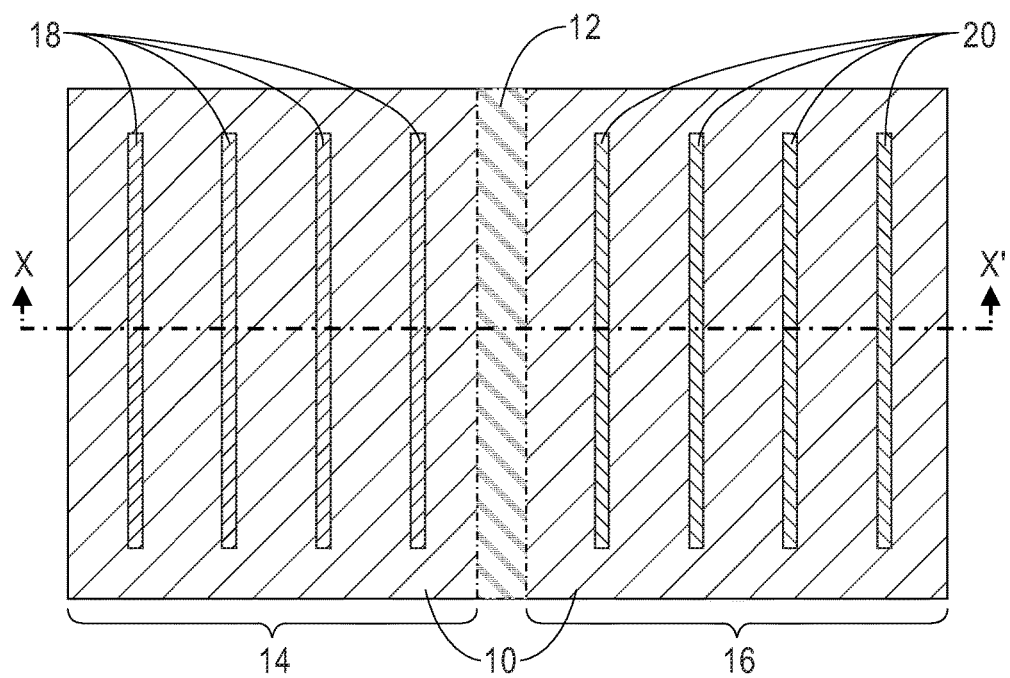
FIG. 1A is a top down view of an exemplary semiconductor structure including a plurality of first semiconductor fins within an nFET device region of a semiconductor substrate, and a plurality of second semiconductor fins within a pFET device region of the semiconductor substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements in the various embodiments of the present application are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1B:
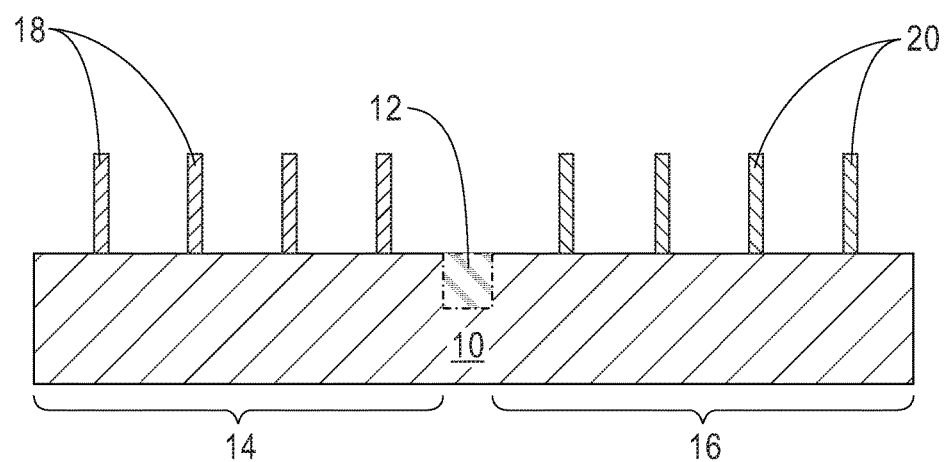
FIG. 1B is a cross sectional view of the exemplary semiconductor structure of FIG. 1A through vertical plane X-X'.

Referring first to FIGS. 1A-1B, there is illustrated an exemplary semiconductor structure that can be employed in one embodiment of the present application. The exemplary semiconductor structure includes a plurality of first semiconductor fins 18 within an nFET device region 14 of a semiconductor substrate 10, and a plurality of second semiconductor fins 20 within a pFET device region 16 of the semiconductor substrate 10. In some embodiments of the present application, the nFET device region 14 is separated from the pFET device region 16 by a trench isolation structure 12. In other embodiments of the present application, the trench isolation structure 12 can be omitted.

In some embodiments of the present application, the semiconductor substrate 10 can be a bulk semiconductor substrate. When a bulk semiconductor substrate is employed as the semiconductor substrate 10, the bulk semiconductor substrate can be comprised of any semiconductor material including, but not limited to, Si, Ge, SiGe, SiC, SiGeC, and III/V compound semiconductors such as, for example, InAs, GaAs, and InP. Multilayers of these semiconductor materials can also be used as the semiconductor material(s) for providing a bulk semiconductor substrate that can be employed as semiconductor substrate 10 in the present application. In one embodiment, the semiconductor substrate 10 can be comprised of a single crystalline semiconductor material, such as, for example, single crystalline silicon. In other embodiments, the semiconductor substrate 10 may comprise a polycrystalline semiconductor material such as polycrystalline silicon. In yet another embodiment of the present application, the semiconductor substrate 10 may be comprised of an amorphous semiconductor material such as, for example, amorphous silicon. Typically, the semiconductor substrate 10 is comprised of silicon.

In another embodiment, a semiconductor-on-insulator (SOI) substrate (not specifically shown) can be employed as the semiconductor substrate 10. In such an embodiment, the trench isolation structure can be omitted. Although not specifically shown, one skilled in the art understands that an SOI substrate includes a handle substrate, a buried insulator layer located on an upper surface of the handle substrate, and a top semiconductor layer located on an uppermost surface of the buried insulator layer. The handle substrate provides mechanical support for the buried insulator layer and the top semiconductor layer.

The handle substrate and the top semiconductor layer of the SOI substrate may comprise the same, or different, semiconductor material. The term "semiconductor" as used herein in connection with the semiconductor material of the handle substrate and the top semiconductor layer denotes any semiconductor material including, for example, Si, Ge, SiGe, SiC, SiGeC, and III/V compound semiconductors such as, for example, InAs, GaAs, or InP. Multilayers of these semiconductor materials can also be used as the semiconductor material of the handle substrate and/or the top semiconductor layer. Typically, the top semiconductor layer and the handle substrate of the SOI substrate are both comprised of silicon.

In some embodiments, the handle substrate is a non-semiconductor material including, for example, a dielectric material and/or a conductive material. In yet other embodiments, the handle substrate can be omitted and a substrate including an insulator layer and a semiconductor layer can be used as the semiconductor substrate 10.

In some embodiments, the handle substrate and the top semiconductor layer may have the same or different crystal orientation. For example, the crystal orientation of the handle substrate and/or the top semiconductor layer may be {100}, {110}, or {111}. Other crystallographic orientations besides those specifically mentioned can also be used in the present application. The handle substrate and/or the top semiconductor layer of the SOI substrate may be a single crystalline semiconductor material, a polycrystalline material, or an amorphous material. Typically, at least the top semiconductor layer of the SOI substrate is a single crystalline semiconductor material. In some embodiments, the top semiconductor layer that is located atop the buried insulator layer can be processed to include semiconductor regions having different crystal orientations.

The buried insulator layer of the SOI substrate may be a crystalline or non-crystalline oxide or nitride. In one embodiment, the buried insulator layer is an oxide such as, for example, silicon dioxide. The buried insulator layer may be continuous or it may be discontinuous. When a discontinuous buried insulator region is present, the insulator region exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the Si-containing semiconductor layer to a layer having a thickness that is more desirable.

In some embodiments, the semiconductor substrate 10 can be processed to include at least one trench isolation structure 12. In one embodiment and as shown in FIG. 1B, the trench isolation structure 12 has vertical sidewall surfaces. In another embodiment of the present application (not shown), the trench isolation structure 12 may have tapered sidewall surfaces. In some embodiments of the present application (and as shown in FIG. 1B), the trench isolation structure 12 has a topmost surface that is coplanar with a topmost surface of semiconductor substrate 10. In other embodiments of the present application (not shown), the trench isolation structure 12 may have a topmost surface that extends above the topmost surface of the semiconductor substrate 10. The trench isolation structure 12 can be formed utilizing a conventional trench isolation process well known to those skilled in the art. For example, lithography, etching and filling of the trench with a trench dielectric such as an oxide may be used in forming the trench isolation structure 12. Optionally, a liner may be formed in the trench prior to trench fill, a densification step may be performed after the trench fill and a planarization process may follow the trench fill as well.

As indicated above, FIGS. 1A and 1B also illustrate that the semiconductor substrate 10 includes an nFET device region 14 and a pFET device region 16. The nFET device region 14 is an area of the semiconductor substrate 10 in which nFET devices will be subsequently formed, while the pFET device region 16 is another area of the semiconductor substrate 10 in which pFET devices will be subsequently formed.

The nFET device region 14 shown in FIGS. 1A-1B has been processed to include a plurality of first semiconductor fins 18, while the pFET device region 16 has been processed to include a plurality of second semiconductor fins 20. The plurality of first semiconductor fins 18 may be referred to herein as nFET semiconductor fins, while the plurality of second semiconductor fins 20 may be referred to herein as pFET semiconductor fins. nFET semiconductor fins that are used in providing the first semiconductor fins 18 in the nFET device region 14 comprise a semiconductor material that provides a high electron mobility for nFET devices. pFET semiconductor fins that are used in providing the second semiconductor fins 20 in the pFET device region 16 comprise a semiconductor material that provides a high hole mobility for pFET devices. As used herein, a "fin" refers to a contiguous structure including a semiconductor material and including a pair of vertical sidewalls that are parallel to each other. As used herein, a surface is "vertical" if there exists a vertical plane from which the surface does not deviate by more than three times the root mean square roughness of the surface.

As shown, the plurality of first semiconductor fins 18 and the plurality of second semiconductor fins 20 are oriented parallel to each other. Each first semiconductor fin of the plurality of first semiconductor fins 18 and/or each second semiconductor fin of the plurality of second semiconductor fins 20 has an epitaxial relationship, i.e., same crystal orientation, as that of the semiconductor substrate 10.

In one embodiment of the present application, the nFET semiconductor fins (and hence each first semiconductor fin of the plurality of first semiconductor fins 18) are comprised of an III-V compound semiconductor material. In some examples, the nFET semiconductor fins (and hence each first semiconductor fin of the plurality of first semiconductor fins 18) may be comprised of InGaAs, GaAs, InP, and InAs. In one embodiment of the present application, each nFET semiconductor fin (and hence each first semiconductor fin of the plurality of first semiconductor fins 18) may comprise a single III-V compound semiconductor material. In another embodiment of the present application, each nFET semiconductor fin (and hence each first semiconductor fin of the plurality of first semiconductor fins 18) may comprise two or more III-V compound semiconductor materials. In some embodiments of the present application (and as is the case when an uppermost portion of the semiconductor substrate 10 comprises a different semiconductor material than the bottommost portion of the nFET semiconductor fins), a material interface is present between the bottommost surface of each first semiconductor fin of the plurality of first semiconductor fins 18 and a topmost surface of the semiconductor substrate 10. In other embodiments of the present application (and as is the case when an uppermost portion of the semiconductor substrate 10 comprises a same III-V compound semiconductor material as the bottommost portion of the nFET semiconductor fins), no material interface is present between the bottommost surface of each first semiconductor fin of the plurality of first semiconductor fins 18 and a topmost surface of the semiconductor substrate 10.

In one embodiment of the present application, each first semiconductor fin of the plurality of first semiconductor fins 18 is comprised of a same III-V compound semiconductor material. In another embodiment of the present application, a predetermined number of first semiconductor fins of the plurality of first semiconductor fins 18 may comprise a first III-V compound semiconductor material, while the remaining number of first semiconductor fins of the plurality of first semiconductor fins 18 may comprise a second III-V compound semiconductor material that is different from the first III-V compound semiconductor material.

In some embodiments of the present application (and as shown), each first semiconductor fin of the plurality of first semiconductor fins 18 has a same height and/or same width. In other embodiments of the present application, some of the first semiconductor fins of the plurality of first semiconductor fins 18 have a first height and/or a first width, while other first semiconductor fins of the plurality of first semiconductor fins 18 have a second height and/or second width that differs from the first height and/or first width.

In one embodiment of the present application, each first semiconductor fin of the plurality of first semiconductor fins 18 has a height from 10 nm to 100 nm, and a width from 4 nm to 30 nm. In another embodiment of the present application, each first semiconductor fin of the plurality of first semiconductor fins 18 has a height from 15 nm to 60 nm, and a width from 5 nm to 12 nm.

In some embodiments of the present application (and as shown), each first semiconductor fin of the plurality of first semiconductor fins 18 has a topmost surface that is bare (i.e., uncovered). In other embodiments of the present application (now shown), each first semiconductor fin of the plurality of first semiconductor fins 18 has a topmost surface that is covered by a hard mask cap portion. In yet other embodiments of the present application (also not shown), some of the first semiconductor fins of the plurality of first semiconductor fins 18 have a topmost surface that is bare, while other first semiconductor fins of the plurality of first semiconductor fins 18 are covered with a hard mask portion. If present, the hard mask cap portion comprises a dielectric hard mask material such as, for example, silicon dioxide, silicon nitride and/or silicon oxynitride.

In one embodiment of the present application, the pFET semiconductor fins (and hence each second semiconductor fin of the plurality of second semiconductor fins 20) are comprised of unalloyed silicon, unalloyed germanium, a silicon germanium alloy or a multilayered combination of such semiconductor materials such as, for example, a stack of, from bottom to top, unalloyed silicon and a silicon germanium alloy. In some embodiments of the present application (and as is the case when an uppermost portion of the semiconductor substrate 10 comprises a different semiconductor material than the bottommost portion of the pFET semiconductor fins), a material interface is present between the bottommost surface of each second semiconductor fin of the plurality of second semiconductor fins 20 and a topmost surface of the semiconductor substrate 10. In other embodiments of the present application (and as is the case when an uppermost portion of the semiconductor substrate 10 comprises a same semiconductor material as the bottommost portion of the pFET semiconductor fins), no material interface is present between the bottommost surface of each second semiconductor fin of the plurality of second semiconductor fins 20 and a topmost surface of the semiconductor substrate 10.

In one embodiment of the present application, each second semiconductor fin of the plurality of second semiconductor fins 20 is comprised of a same semiconductor material, i.e., all of the second semiconductor fins 20 are comprised of unalloyed silicon. In another embodiment of the present application, a predetermined number of second semiconductor fins of the plurality of second semiconductor fins 20 may comprise a first semiconductor material (i.e., unalloyed silicon) while the remaining number of second semiconductor fins of the plurality of second semiconductor fins 20 may comprise a second semiconductor material (i.e., unalloyed germanium or a silicon germanium alloy) that is different from the first semiconductor material.

In some embodiments of the present application (and as shown), each second semiconductor fin of the plurality of second semiconductor fins 20 has a same height and/or same width. In other embodiments of the present application, some of the second semiconductor fins of the plurality of second semiconductor fins 20 have a first height and/or a first width, while other second semiconductor fins of the plurality of second semiconductor fins 20 have a second height and/or second width that differs from the first height and/or first width.

In one embodiment of the present application, each second semiconductor fin of the plurality of second semiconductor fins 20 has a height from 10 nm to 100 nm, and a width from 4 nm to 30 nm. In another embodiment of the present application, each second semiconductor fin of the plurality of second semiconductor fins 20 has a height from 15 nm to 60 nm, and a width from 5 nm to 12 nm.

In some embodiments of the present application (and as shown), each second semiconductor fin of the plurality of second semiconductor fins 20 has a topmost surface that is bare (i.e., uncovered). In other embodiments of the present application (now shown), each second semiconductor fin of the plurality of second semiconductor fins 20 has a topmost surface that is covered by a hard mask cap portion. In yet other embodiments of the present application (also not shown), some of the second semiconductor fins of the plurality of second semiconductor fins 20 have a topmost surface that is bare, while other second semiconductor fins of the plurality of second semiconductor fins 20 are covered with a hard mask portion. If present, the hard mask cap portion comprises a dielectric hard mask material such as, for example, silicon dioxide, silicon nitride and/or silicon oxynitride.

The plurality of first semiconductor fins 18 and the plurality of second semiconductor fins 20 both of which extend upward from the surface of the semiconductor substrate 10 can be formed utilizing techniques well known to those skilled in the art. For example, the exemplary semiconductor structure shown in FIGS. 1A-1B can be formed by first providing a semiconductor substrate that is comprised of at least one of the materials that is present in either the plurality of first semiconductor fins 18 or the plurality of second semiconductor fins 20. In some embodiments, a wafer bonding technique can be used to provide the semiconductor substrate 10. A block mask can then be formed on one area of the substrate and then the unprotected area can be subjected to a recessing process that exposes a sub-surface of the substrate. Epitaxial growth can then be used in providing a semiconductor material on the sub-surface of the substrate. After epitaxial growth, the block mask can be removed and the structure can be patterned to provide the plurality of first semiconductor fins 18 and the plurality of second semiconductor fins 20. Patterning is typically performed utilizing a sidewall image transfer process.

In another example, the exemplary semiconductor structure shown in FIGS. 1A-1B can be formed by first providing a semiconductor substrate that is comprised of one of the materials that is present in either the plurality of first semiconductor fins 18 or the plurality of second semiconductor fins 20. A plurality of semiconductor fins and trench isolation structures are then formed within a portion of the semiconductor substrate. A block mask can be formed over the semiconductor fins and trench isolation structures in one of the device regions of the substrate, while leaving the semiconductor fins and trench isolation structures in another of the device regions exposed. The exposed semiconductor fins can then be completely or partially removed and an aspect ratio trapping epitaxial growth process such as described, for example, in U.S. Patent Application Publication No. 2011/0049568 to Lochtefeld et al., the entire content and disclosure of which is incorporated herein by reference can be used to form each first semiconductor fin or each second semiconductor fin described above.

Figure 2A:
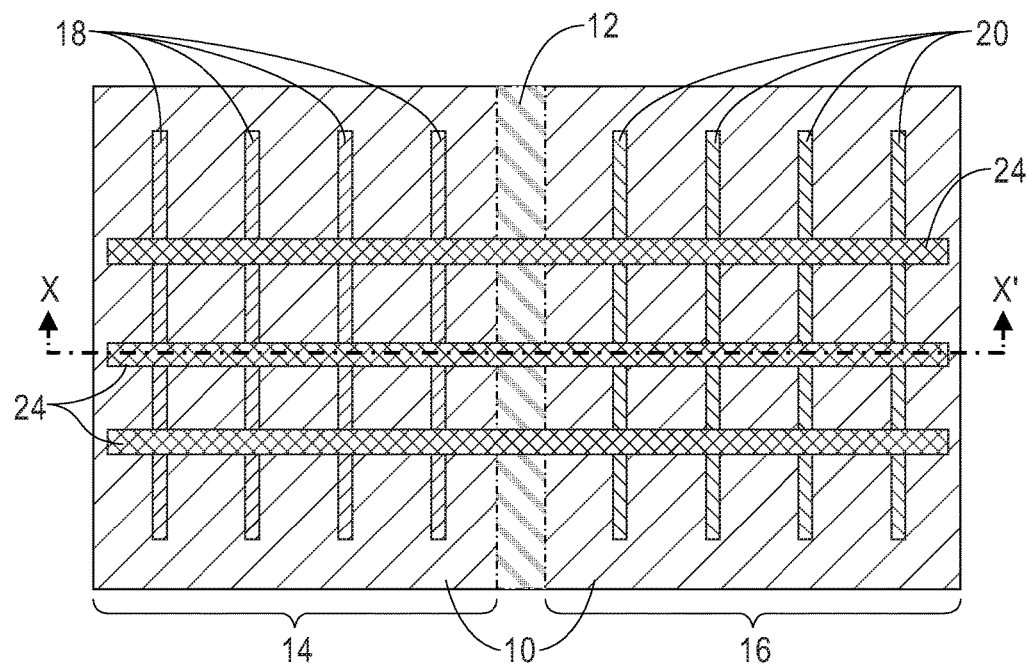
FIG. 2A is a top down view of the exemplary semiconductor structure of FIG. 1A after formation of a plurality of functional gate structures straddling each first semiconductor fin within the nFET device region and straddling each second semiconductor fin within the pFET device region.
Figure 2B:
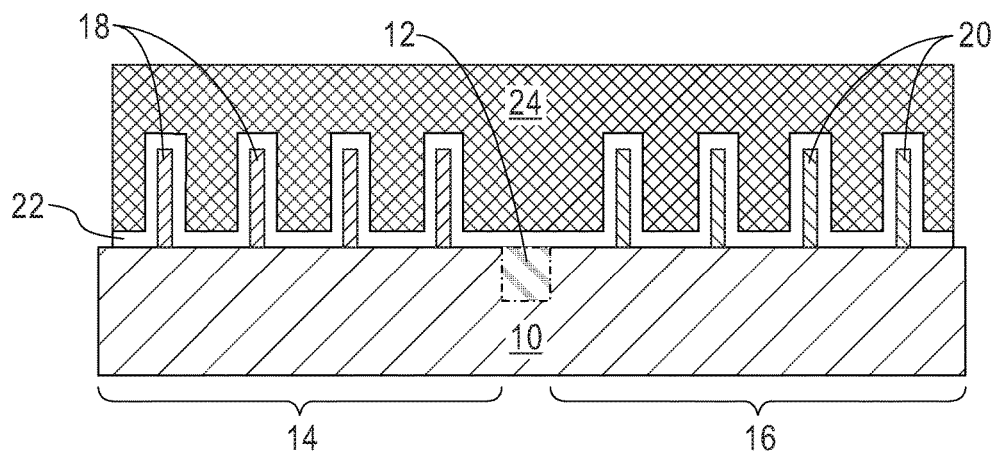
FIG. 2B is a cross sectional view of the exemplary semiconductor structure of FIG. 2A through vertical plane X-X'.

Referring now to FIGS. 2A-2B, there is illustrated the exemplary semiconductor structure of FIGS. 1A-1B after formation of a plurality of functional gate structures (22, 24) straddling each first semiconductor fin of the plurality of first semiconductor fins 18 within the nFET device region 14 and straddling each second semiconductor fin of the plurality of second semiconductor fins 20 within the pFET device region 16. By "straddling" it is meant that the functional gate structure is located directly above a topmost surface of each semiconductor fin as well as adjacent two vertical sidewalls of each semiconductor fin. The term "functional gate structure" is used throughout the present application as a permanent gate structure used to control output current (i.e., flow of carriers in the channel) of a semiconducting device through electrical or magnetic fields.

In one embodiment, and as shown herein, each functional gate structure (22, 24) can be formed utilizing a gate first process. In a gate first process, at least one functional gate structure is formed prior to forming the source and drain regions. The at least one functional gate structure can be formed by deposition of a gate material stack and then patterning the gate material stack by lithography and etching.

Each functional gate structure includes a gate dielectric material portion 22 and a gate conductor portion 24. While the embodiment that is illustrated discloses that the gate dielectric material portion 22 and the gate conductor portion 24 are the same in the nFET device region 14 and the pFET device region 16, it is also possible to form a gate dielectric material portion and/or a gate conductor portion in the nFET device region 14 that is different from the gate dielectric material portion and/or the gate conductor portion in the pFET device region 16. In such embodiments, conventional block mask technology can be used in forming the different gate dielectric material portion and/or different gate conductor portion in each of the device regions.

In the embodiment illustrated in the drawings, the gate dielectric portion 22 is present on three surfaces (i.e., the two vertical sidewalls and the topmost surface) of each first semiconductor fin of the plurality of first semiconductor fins 18 and three surfaces of each second semiconductor fin of the plurality of second semiconductor fins 20 (i.e., the two vertical sidewalls and the topmost surface). In other embodiments, and when a hard mask cap portion is present, the gate dielectric portion is located only on the two vertical sidewalls of the semiconductor fins.

The gate dielectric material portion 22 includes any gate dielectric material. In one embodiment, the gate dielectric material that provides the gate dielectric material portion 22 can be a semiconductor oxide, a semiconductor nitride, and/or a semiconductor oxynitride. In one example, the gate dielectric material that provides each gate dielectric material portion 22 can be composed of silicon dioxide, silicon nitride and/or silicon oxynitride. In another embodiment of the present application, the gate dielectric material that provides the gate dielectric material portion 22 may include at least a dielectric metal oxide. Exemplary dielectric metal oxides that can be used as the gate dielectric material that provides the gate dielectric material portion 22 include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a dielectric metal oxide can be formed and used as the gate dielectric material that provides the gate dielectric material portion 22.

In some embodiments of the present application, the gate dielectric material that provides the gate dielectric material portion 22 can be formed by a deposition technique such as, for example, chemical vapor deposition (CVD), plasma enhanced chemical vapor deposition (PECVD), physical vapor deposition (PVD), sputtering, or atomic layer deposition. In another embodiment of the present application, the gate dielectric material that provides the gate dielectric material portion 22 can be formed by a thermal growth technique such as, for example, thermal oxidation and/or thermal nitridation. In yet a further embodiment of the present application, a combination of a deposition and thermal growth may be used in forming a multilayered gate dielectric structure.

In one embodiment of the present application, the gate dielectric material that provides the gate dielectric material portion 22 can have a thickness in a range from 1 nm to 10 nm. Other thicknesses that are lesser than or greater than the aforementioned thickness range can also be employed for the gate dielectric material that provides the gate dielectric material portion 22.

The gate conductor portion 24 may comprise any conductive material. Examples of conductive materials that can provide each gate conductor portion 24 include, but are not limited to, doped polysilicon, doped silicon germanium, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), or multilayered combinations thereof. In one embodiment, an entirety of the conductive material that provides the gate conductor portion 24 is comprised of a doped polysilicon or doped polysilicon germanium. In another embodiment, a lower portion of the conductive material that provides the gate conductor portion 24 is comprised a conductive material other than doped polysilicon or doped polysilicon germanium, and an upper portion of the conductive material that provides the gate conductor portion 24 is comprised of doped polysilicon or doped silicon germanium.

The conductive material that provides the gate conductor portion 24 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. In one embodiment, the conductive material that provides the gate conductor portion 24 has a thickness from 1 nm to 100 nm. Other thicknesses that are lesser than or greater than the aforementioned thickness range can also be employed for the conductive material that provides the gate conductor portion 24.

As mentioned above, the functional gate structure can be formed by first providing a material stack of, from bottom to top, a gate dielectric material and a conductive material. In some embodiments, block mask technology may be used to form different gate dielectric materials and/or conductive materials within the various device regions. Following the formation of the material stack, the material stack can be patterned by lithography and etching. Lithography can include forming a photoresist (not shown) on the topmost surface of the conductive material of the material stack, exposing the photoresist to a desired pattern of radiation, and then developing the exposed photoresist with a resist developer to provide a patterned photoresist atop the material stack. At least one etch is then employed which transfers the pattern from the patterned photoresist into the various materials of the material stack. In one embodiment, the etch used for pattern transfer may include a dry etch process such as, for example, reactive ion etching, plasma etching, ion beam etching or laser ablation. In another embodiment, the etch used for pattern transfer may include a wet chemical etchant such as, for example, KOH (potassium hydroxide). In yet another embodiment, a combination of a dry etch and a wet chemical etch may be used to transfer the pattern. After transferring the pattern into the material layers, the patterned photoresist can be removed utilizing a resist stripping process such as, for example, ashing. After patterning the gate material stack, a functional gate structure including gate dielectric material portion 22 and a gate conductor portion 24 is formed. At this point of the present application, conventional processing can be used to form a dielectric spacer on the exposed sidewalls of the functional gate structure.

Figure 3A:
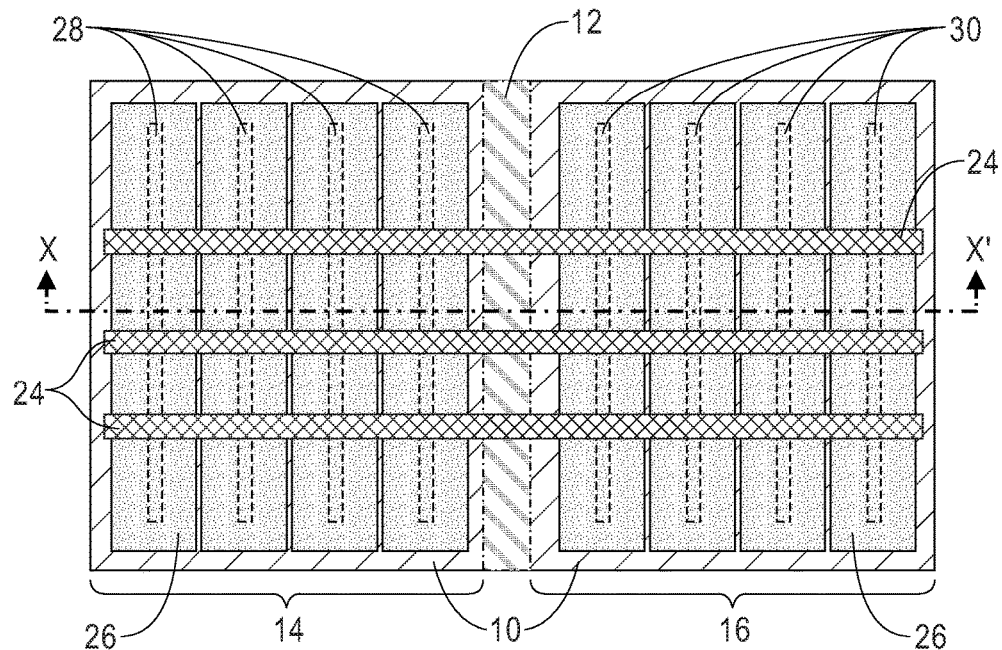
FIG. 3A is a top down view of the exemplary semiconductor structure of FIG. 2A after epitaxially growing a boron-doped silicon germanium alloy material from exposed surfaces of each first semiconductor fin within the nFET device region, and from exposed surfaces of each second semiconductor fin within the pFET device region and performing a subsequent anneal.
Figure 3B:
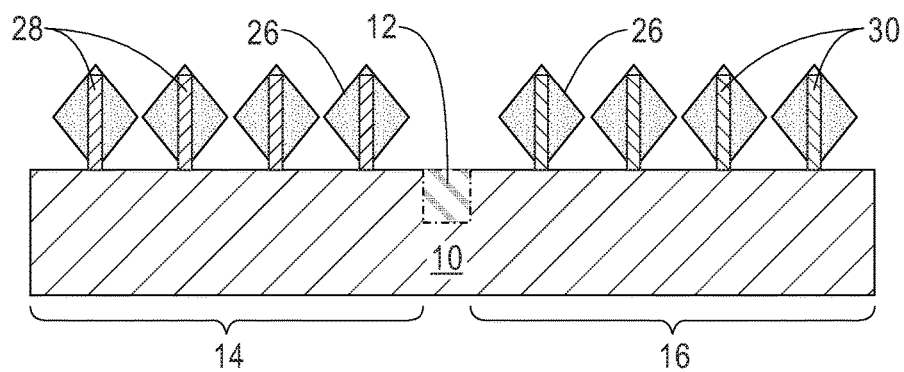
FIG. 3B is a cross sectional view of the exemplary semiconductor structure of FIG. 3A through vertical plane X-X'.

Referring now to FIGS. 3A-3B, there is illustrated the exemplary semiconductor structure of FIGS. 2A-2B after epitaxially growing, i.e. depositing, a boron-doped silicon germanium alloy material (i.e., SiGe:B) 26 from exposed surfaces (i.e., sidewall surfaces and optionally the topmost surface if not protected by a hard mask cap portion) of each first semiconductor fin 18 within the nFET device region 14, and from exposed surfaces (i.e., sidewall surfaces and optionally the topmost surface if not protected by a hard mask cap portion) of each second semiconductor fin 20 within the pFET device region 16 and performing a subsequent anneal. The growth of the boron-doped silicon germanium alloy material 26 along the sidewalls of each first semiconductor fin 18 and each second semiconductor fin 20 occurs at a faster rate than along the topmost surface of each first semiconductor fin 18 and each second semiconductor fin 20.

The terms "epitaxial growing and/or depositing" and "epitaxially formed and/or grown" are used throughout the present application to denote the growth of a semiconductor material on a deposition surface of a semiconductor material, in which the semiconductor material being grown has the same crystalline characteristics as the semiconductor material of the deposition surface. Thus, in this instance, the boron-doped silicon germanium alloy material 26 that is formed in the nFET device region 14 has an epitaxial relationship, i.e., same crystal orientation, with the growth surfaces of each first semiconductor fin of the plurality of first semiconductor fins 18, while the boron-doped silicon germanium alloy material 26 that is formed in the pFET device region 16 has an epitaxial relationship, i.e., same crystal orientation, with the growth surfaces of each second semiconductor fin of the plurality of second semiconductor fins 20.

In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth process apparatuses that are suitable for use in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

In one embodiment of the present application, the boron-doped silicon germanium alloy material 26 can be formed utilizing a precursor gas mixture that can include a silicon source, a germanium source, a boron source and a carrier gas. Examples of a silicon sources that can be employed include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of a germanium source include germane, digermane, halogermane, dichlorogermane, trichlorogermane, tetrachlorogermane and combinations thereof. An example of a boron source is diborane. Carrier gases like hydrogen, nitrogen, helium and argon can be used. In another embodiment of the present application, the boron-doped silicon germanium alloy material 26 can be formed utilizing a precursor gas mixture that can include a single silicon and germanium source, a boron source and a carrier gas.

In accordance with an embodiment of the present application, the boron-doped silicon germanium alloy material 26 can contain a boron concentration of from $1 \times 10^{19}$ atoms/cm$^3$ to $1 \times 10^{21}$ atoms/cm$^3$. In accordance with another embodiment of the present application, the boron-doped silicon germanium alloy material 26 can contain a boron concentration of from $5 \times 10^{19}$ atoms/cm$^3$ to $5 \times 10^{20}$ atoms/cm$^3$. The boron-doped silicon germanium alloy material 26 can have a germanium content of from 20 atomic % to 50 atomic %. The aforementioned concentration ranges for the boron-doped silicon germanium alloy material 26 are pre-annealing. Post-annealing, the concentration of the various elements with the boron-doped silicon germanium alloy material 26 would be less than their post-annealing values.

In some embodiments, and as shown in FIG. 3B, each boron-doped silicon germanium alloy material 26 has a diamond shape. In some embodiments, and as shown, a gap remains between the tip of each diamond shaped boron-doped silicon germanium alloy material 26 and its neighboring diamond shaped boron-doped silicon germanium alloy material 26. In some embodiments (not shown), the boron-doped silicon germanium alloy material 26 can be used to merge neighboring semiconductor fins. In yet another embodiment in which a hard mask cap portion is present on the topmost surface of a semiconductor fin, a triangular shaped boron-doped silicon germanium alloy material 26 is formed protruding from the exposed sidewall surfaces of each semiconductor fin that is capped with a hard mask material portion.

After epitaxially forming the boron-doped silicon germanium alloy material 26, an anneal, i.e., junction anneal, is performed. In one embodiment, the anneal can be performed at a temperature from 700° C. to 1150° C. In another embodiment, the anneal can be performed at a temperature from 800° C. to 1000° C. The anneal is typically performed in an inert ambient including, for example, helium, argon or a helium-argon mixture. During the anneal, atoms of silicon and germanium diffuse from the boron-doped silicon germanium alloy material 26 into each of the first semiconductor fins 18 (i.e., the nFET semiconductor fins) not protected by the plurality of functional gate structures to provide source/drain junctions 28 comprising atoms of silicon and germanium therein. At the same time, boron from the from the boron-doped silicon germanium alloy material diffuses into each of the second semiconductor fins 20 not protected by the plurality of functional gate structures to provide source/drain junctions 30 comprising atoms of boron therein.

Stated in other term, the anneal causes diffusion of atoms of silicon and germanium from the boron-doped silicon germanium alloy material 26 into the each first semiconductor fin of the plurality of first semiconductor fins 18 and act as an n-type dopant forming a junction (i.e., source region or drain region) 28 in each first semiconductor fin of the plurality of first semiconductor fins 18. Boron also diffuses, however since boron is a Group IIIA element it does not have any adverse effect on the junctions 28 within the nFET device region 14. During the anneal, atoms of boron will diffuse into each second semiconductor fin of the plurality of second semiconductor fins 20 to form a junction (a source region or drain region) 30 therein. There is no diffusion of silicon and germanium in the pFET device region 16.

The process may continue by forming a contact structure. Unlike prior art processes, a single epitaxial process for merging and forming junctions is used. Additional the same contact metal can be used in both the nFET device region 14 and the pFET device region 16. The contact structure can be formed by first providing a metal semiconductor alloy forming metal on the exposed surfaces of the boron-doped silicon germanium alloy material 26. Examples of metal semiconductor alloy forming metals include at least one of nickel (Ni), platinum (Pt), palladium (Pd), titanium (Ti), tungsten (W), and cobalt (Co). The metal semiconductor alloy forming metal can be formed by any conventional deposition processes including those mentioned above in providing the gate conductor portion 24. In some embodiments, a diffusion barrier such as, for example, a metal nitride (TiN or TaN) can be formed on the metal semiconductor alloy forming metal. Another anneal can be performed to form the contact structure.

Although the above specifically describes and illustrates a process in which the functional gate structures are formed by gate first process. It is also possible to apply the present application to a gate last process. In such an embodiment, a sacrificial gate structure (not shown) is first formed straddling each semiconductor fin (18, 20) within the various device regions. The term "sacrificial gate structure" is used throughout the present application to denote a material that serves as a placeholder structure for a functional gate structure to be subsequently formed.

The sacrificial gate structure can be formed by first providing a blanket layer of a sacrificial gate material. The blanket layer of sacrificial gate material can be formed, for example, by chemical vapor deposition or plasma enhanced chemical vapor deposition. The thickness of the blanket layer of sacrificial gate material can be from 50 nm to 300 nm, although lesser and greater thicknesses can also be employed. The blanket layer of sacrificial gate material can include any material that can be selectively removed from the structure during a subsequently performed etching process. In one embodiment, the blanket layer of sacrificial gate material may be composed of polysilicon. In another embodiment of the present application, the blanket layer of sacrificial gate material may be composed of a metal such as, for example, Al, W, or Cu. After providing the blanket layer of sacrificial gate material, the blanket layer of sacrificial gate material can be patterned by lithography and etching so as to form the sacrificial gate structures.

Next, a dielectric spacer can be optionally formed on sidewalls of each sacrificial gate structure. At this point, the single deposition of boron-doped silicon germanium alloy material and anneal is performed as discussed herein above. Next, a dielectric material is provided that has an upper surface that is planar to each sacrificial gate structure. Then, each sacrificial gate structure can be replaced with a functional gate structure as defined above.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed as new is:

1. A semiconductor structure comprising:
a semiconductor substrate containing an nFET device region and a pFET device region, wherein a plurality of nFET semiconductor fins extend upwards from a surface of said semiconductor substrate in said nFET device region, and a plurality of pFET semiconductor fins extend upwards from another surface of said semiconductor substrate in said pFET device region;
a plurality of functional gate structures straddling each nFET semiconductor fin and each pFET semiconductor fin; and
a boron-doped silicon germanium alloy material protruding from exposed surfaces of said nFET semiconductor fins and said pFET semiconductor fins not covered by said plurality of functional gate structures, wherein each of said nFET semiconductor fins not covered by said plurality of functional gate structures contains a source/drain junction containing atoms consisting of silicon, germanium, and boron, and wherein each of said pFET semiconductor fins not covered by said plurality of functional gate structures contains a source/drain junction containing boron atoms.

2. The semiconductor structure of claim 1, wherein each of said nFET semiconductor fins comprises an III-V compound semiconductor material, and each of said pFET semiconductor fins comprises silicon, germanium or a silicon germanium alloy.

3. The semiconductor structure of claim 1, wherein a bottommost surface of at least one of said nFET semiconductor fins and said pFET semiconductor fins has an epitaxial relationship with said surface of said semiconductor substrate.

4. The semiconductor structure of claim 1, wherein said boron-doped silicon germanium alloy material has an epitaxial relationship with said exposed surfaces of said nFET semiconductor fins and said pFET semiconductor fins not protected by said plurality of functional gate structures.

5. The semiconductor structure of claim 1, wherein each of said nFET semiconductor fins and each of said pFET semiconductor fins have a same height.

6. The semiconductor structure of claim 1, wherein each functional gate structure includes a gate dielectric portion and a gate conductor portion.

7. The semiconductor structure of claim 1, wherein said semiconductor substrate and said plurality of nFET semiconductor fins comprise a first semiconductor material, and said plurality of pFET semiconductor fins comprise a second semiconductor material that differs from the first semiconductor material.

8. The semiconductor structure of claim 1, wherein said semiconductor substrate and said plurality of pFET semiconductor fins comprise a first semiconductor material, and said plurality of nFET semiconductor fins comprise a second semiconductor material that differs from the first semiconductor material.

9. The semiconductor structure of claim 1, wherein said boron-doped silicon germanium alloy material protruding from exposed surfaces of said nFET semiconductor fins has an epitaxial relationship with said nFET semiconductor fins, and said boron-doped silicon germanium alloy material protruding from exposed surfaces of said pFET semiconductor fins has an epitaxial relationship with said pFET semiconductor fins.

10. The semiconductor structure of claim 1, wherein each of said nFET semiconductor fins comprises an III-V compound semiconductor material, and a first set of said pFET semiconductor fins comprises a first semiconductor material, and a second set of said pFET semiconductor fins comprises a second semiconductor material that differs from the first semiconductor material, and wherein said first and second semiconductor materials are selected from silicon, germanium and a silicon germanium alloy.

11. The semiconductor structure of claim 1, wherein said exposed surfaces of said nFET semiconductor fins and said pFET semiconductor fins not covered by said plurality of functional gate structures consist of only sidewall surfaces.

12. The semiconductor structure of claim 1, wherein said exposed surfaces of said nFET semiconductor fins and said pFET semiconductor fins not covered by said plurality of functional gate structures consist of sidewall surfaces and a topmost surface.

13. The semiconductor structure of claim 1, wherein said source/drain junction of each of said pFET semiconductor fins not covered by said plurality of functional gate structures is devoid of any diffused silicon and germanium atoms.

14. The semiconductor structure of claim 12, wherein said boron-doped silicon germanium alloy material is diamond shaped.

15. The semiconductor structure of claim 1, further comprising an isolation structure located in said semiconductor substrate and between said nFET device region and said pFET device region, wherein said isolation structure has a topmost surface that is coplanar with a topmost surface of said semiconductor substrate.

16. The semiconductor structure of claim 1, wherein each functional gate structure is a contiguous structure that straddles said nFET semiconductor fins and said pFET semiconductor fins.

\* \* \* \* \*